(12) United States Patent
Matamis et al.

(10) Patent No.: US 7,221,008 B2
(45) Date of Patent: May 22, 2007

(54) BITLINE DIRECTION SHIELDING TO AVOID CROSS COUPLING BETWEEN ADJACENT CELLS FOR NAND FLASH MEMORY

(75) Inventors: George Matamis, Aichi (JP); Tuan Pham, San Jose, CA (US); Henry Chien, San Jose, CA (US); Hao Fang, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 170 days.

(21) Appl. No.: 10/680,665

(22) Filed: Oct. 6, 2003

(65) Prior Publication Data
US 2005/0072999 A1 Apr. 7, 2005

(51) Int. Cl.
H01L 29/80 (2006.01)
H01L 31/112 (2006.01)
H01L 21/336 (2006.01)
G11C 11/34 (2006.01)
G11C 16/04 (2006.01)

(52) U.S. Cl. ............... 257/261; 438/257; 438/294; 365/185.01; 365/185.02; 365/185.17

(58) Field of Classification Search ............ 438/257, 438/259, 288, 294; 257/261; 365/185.01, 365/185.02, 185.17
See application file for complete search history.

(56) References Cited

U.S. PATENT DOCUMENTS

| 5,043,940 A | 8/1991 | Harari |
| 5,070,032 A | 12/1991 | Yuan |
| 5,095,344 A | 3/1992 | Harari |
| 5,168,465 A | 12/1992 | Harari |
| 5,172,338 A | 12/1992 | Mehrotra |
| 5,198,380 A | 3/1993 | Harari |
| 5,268,318 A | 12/1993 | Harari |
| 5,268,319 A | 12/1993 | Harari |
| 5,297,148 A | 3/1994 | Harari et al. |
| 5,313,421 A | 5/1994 | Guterman |
| 5,315,541 A | 5/1994 | Harari et al. |
| 5,343,063 A | 8/1994 | Yuan |
| 5,380,672 A | 1/1995 | Yuan |
| 5,512,505 A | 4/1996 | Yuan |
| 5,528,547 A * | 6/1996 | Aritome et al. .......... 365/218 |
| 5,534,456 A | 7/1996 | Yuan |
| 5,554,553 A | 9/1996 | Harari |
| 5,579,259 A | 11/1996 | Samachisa |
| 5,595,924 A | 1/1997 | Yuan |
| 5,640,032 A | 6/1997 | Tomioka |
| 5,650,345 A * | 7/1997 | Ogura et al. .............. 438/593 |

(Continued)

OTHER PUBLICATIONS

Y. Takeuchi et al., "A Self-Aligned STI Process Integration for Low Cost and Highly Reliable 1Gbit Flash Memories," *1998 Symposium on VLSI Technology—Digest of Technical Papers*, Jun. 9-11, 1998, pp. 102.

(Continued)

*Primary Examiner*—Carl Whitehead, Jr.
*Assistant Examiner*—Heather Doty
(74) *Attorney, Agent, or Firm*—Winston & Strawn LLP (57) ABSTRACT

A NAND flash memory structure and method of making a flash memory structure with shielding in the bitline direction as well as in wordline and diagonal directions from Yupin effect errors and from disturbs.

32 Claims, 5 Drawing Sheets

U.S. PATENT DOCUMENTS

| | | |
|---|---|---|
| 5,654,217 A | 8/1997 | Yuan |
| 5,661,053 A | 8/1997 | Yuan |
| 5,677,872 A | 10/1997 | Samachisa |
| 5,712,179 A | 1/1998 | Yuan |
| 5,712,180 A | 1/1998 | Guterman et al. |
| 5,747,359 A | 5/1998 | Yuan |
| 5,756,385 A | 5/1998 | Yuan |
| 5,786,988 A | 7/1998 | Harari |
| 5,847,425 A | 12/1998 | Yuan |
| 5,867,429 A | 2/1999 | Chen |
| 5,883,409 A | 3/1999 | Guterman |
| 5,923,976 A | 7/1999 | Kim |
| 5,965,913 A | 10/1999 | Yuan |
| 5,981,335 A | 11/1999 | Chi |
| 5,999,448 A | 12/1999 | Kurihara |
| 6,028,336 A | 2/2000 | Yuan |
| 6,046,935 A | 4/2000 | Takeuchi et al. |
| 6,103,573 A | 8/2000 | Harari |
| 6,151,248 A | 11/2000 | Harari |
| 6,204,122 B1 * | 3/2001 | Joo et al. .................... 438/257 |
| 6,208,545 B1 | 3/2001 | Leedy |
| 6,222,762 B1 | 4/2001 | Guterman et al. |
| 6,235,586 B1 | 5/2001 | Au |
| 6,258,665 B1 | 7/2001 | Shimizu |
| 6,281,075 B1 | 8/2001 | Yuan et al. |
| 6,297,097 B1 | 10/2001 | Jeong |
| 6,417,538 B1 | 7/2002 | Choi |
| 6,512,263 B1 | 1/2003 | Yuan |
| 6,689,658 B2 * | 2/2004 | Wu ........................... 438/257 |
| 6,762,092 B2 | 7/2004 | Yuan |
| 6,894,930 B2 | 5/2005 | Chien et al. |
| 2001/0001491 A1 | 5/2001 | Sakui |
| 2002/0028541 A1 * | 3/2002 | Lee et al. ................... 438/149 |
| 2002/0093073 A1 | 7/2002 | Mori et al. |
| 2002/0096704 A1 * | 7/2002 | Fukumoto et al. .......... 257/315 |
| 2005/0218445 A1 * | 10/2005 | Van Duuren et al. ....... 257/316 |

OTHER PUBLICATIONS

Seiichi Aritome, "Advanced Flash Memory Technology and Trends for File Storage Application," *2000 International Electron Devices Meeting*, Dec. 10-13, 2000, pp. 33.1.1-33.1.4.

International Search Report issued in PCT/US03/18183, dated Mar. 11, 2003, 6 pages.

U.S. Appl. No. 09/667,344, Yuan.

U.S. Appl. No. 09/925,102, Yuan.

International Search Report, PCT US 03/8183.

* cited by examiner

BITLINE DIRECTION SHIELDING TO AVOID CROSS COUPLING BETWEEN ADJACENT CELLS FOR NAND FLASH MEMORY

BACKGROUND OF THE INVENTION

1. Field of the Invention

This invention relates generally to flash electrically erasable and programmable read only memory (EEPROMS), and more specifically to NAND flash memory with a high memory cell density.

2. Related Art

Most existing commercial flash EEPROM products operate each memory cell with two ranges of threshold voltages, one above and the other below a breakpoint level, thereby defining two programmed states. One bit of data is thus stored in each cell, a 0 when programmed into one state and a 1 when programmed into its other state. A chunk of a given number of bits of data is programmed at one time into an equal number of cells. The state of each cell is monitored during programming so that application of programming voltages stops when the threshold level of an individual cell is verified to have moved within the range that represents the value of the bit of data being stored in the cell.

In order to increase the amount of data stored in a flash EEPROM system having a certain number of storage cells, the individual cells are operated with more than two threshold level states. Preferably, two or more bits of data are stored in each cell by operating the individual cells with four or more programmable states. Three threshold breakpoint levels are necessary to define four different threshold states. Such a system is described in U.S. Pat. Nos. 5,043,940 and 5,172,338, which are hereby incorporated by this reference in their entirety. In multi-state operation, an available operating voltage range of the individual cells is divided into an increased number of states. The use of eight or more states, resulting in storing three or more bits of data per cell, is contemplated. The voltage range of each state necessarily becomes smaller as the number of states is increased. This leaves less margin within each state to accommodate any error that might occur during operation of the memory system.

One type of error is termed a "disturb," wherein electrons are unintentionally added to or taken away from a floating gate during operation of the memory. One source of a disturb is the presence of a leaky oxide dielectric positioned between the floating gate and another conductive gate of a cell. The charge level programmed onto a floating gate of a cell changes when such a leaky oxide is present, thus leading to the possibility that the state of the cell will be incorrectly read if the change in charge has been large enough. Since few to no errors can be tolerated in a mass digital data storage system, a sufficient margin for this error is provided by making the voltage range allocated to each state sufficient to include an expanded range of voltages that can occur as the result of such disturbs. This necessarily limits the number of states that can be included in a multistate flash EEPROM system since the total available voltage range is limited.

Another type of error is termed the "Yupin effect." The Yupin effect occurs when the neighboring cell of a selected cell is programmed after the selected cell itself is programmed, and the charges of the neighboring cell influence the voltage of the selected cell. Such interference from the subsequently programmed neighbor cell distorts the voltages of the selected cell, possibly leading to an erroneous identification of its memory state during reading. Other program operations may also interfere with and influence the reading of a selected memory cell. The more compact a memory system becomes, the more influence a neighboring cell or operation has upon a selected cell.

SUMMARY OF THE INVENTION

The present invention is an improved structure for high density NAND type flash memory that minimizes the effect of disturbs and Yupin effect errors. In one embodiment, adjacent floating gates in a string of memory cells are shielded from each other by conductive isolating members. This may reduce disturbs and Yupin effect errors in the bitline direction.

In another embodiment, the conductive isolating members are connected to control gates. Thus, conductive isolating members shield adjacent floating gates and also improve coupling between control gates and floating gates.

In another embodiment, a wordline that connects a row of control gates may shield adjacent floating gates in that row. The word line may be formed so that it extends into the trench isolation area that isolates adjacent strings of cells.

Another embodiment includes a process for fabricating isolating members between floating gates of an array of floating gates.

The present invention is better understood upon consideration of the detailed description below, in conjunction with the accompanying drawings of illustrative embodiments of the invention.

DETAILED DESCRIPTION OF THE INVENTION

The following is a detailed description of illustrative embodiments of the present invention. As these embodiments of the present invention are described with reference to the aforementioned drawings, various modifications or adaptations of the methods and or specific structures described may become apparent to those skilled in the art. All such modifications, adaptations, or variations that rely upon the teachings of the present invention, and through which these teachings have advanced the art, are considered to be within the scope of the present invention. Hence, these descriptions and drawings are not to be considered in a limiting sense, as it is understood that the present invention is in no way limited to the embodiments illustrated.

Figure 1A:
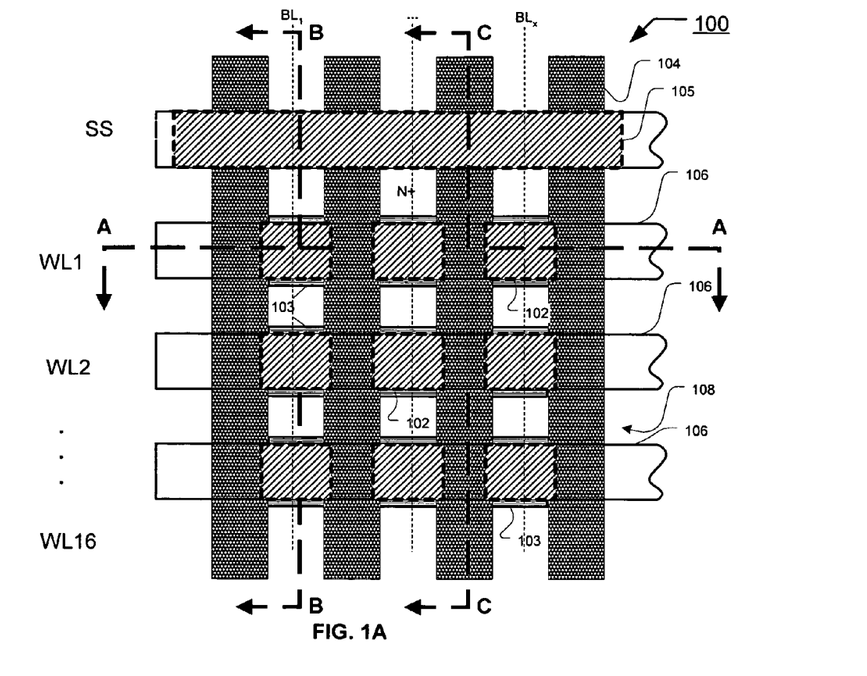
FIG. 1A is a plan view of the structure of memory array 100.
Figure 1B:
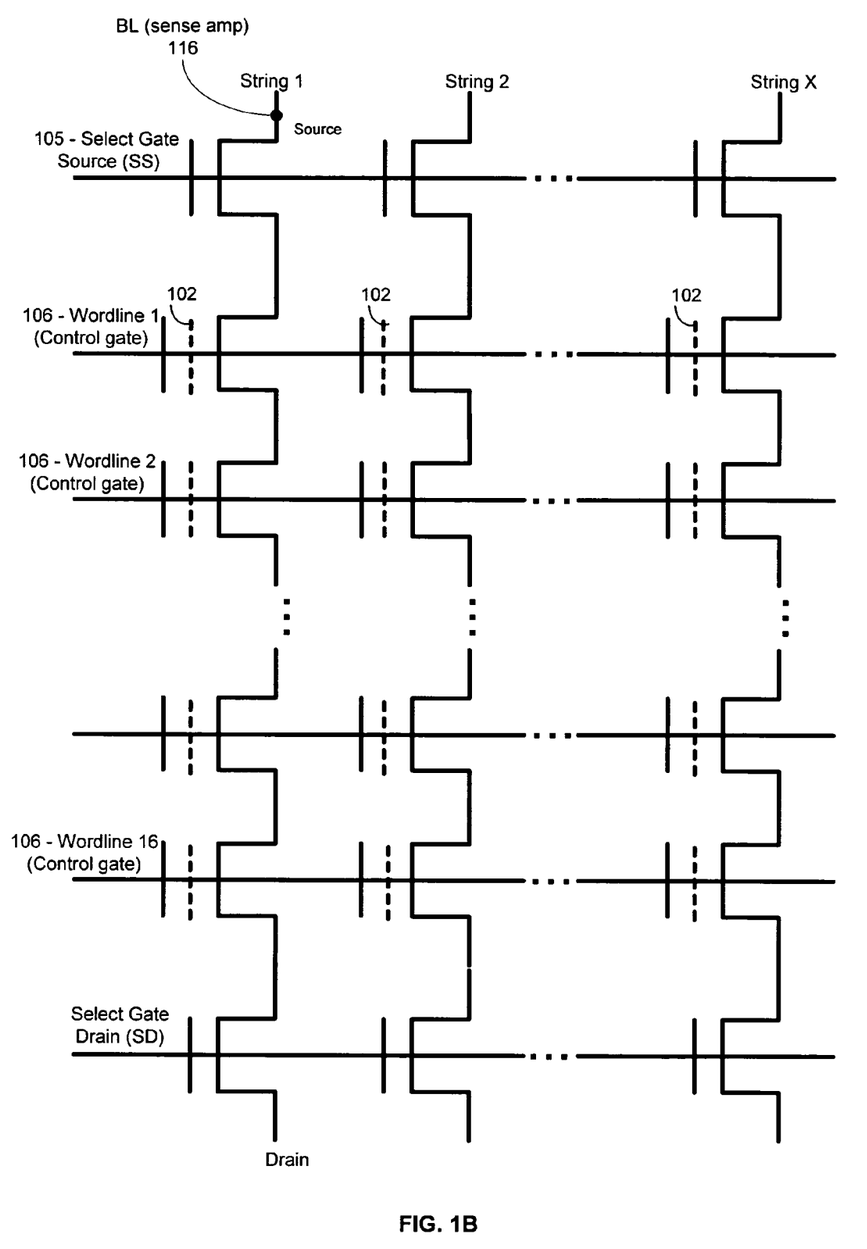
FIG. 1B is an electrical circuit diagram corresponding to the structure of FIG. 1.

FIG. 1A illustrates a plan view of an embodiment of the NAND flash memory of the present invention. FIG. 24 are cross sections taken through the structure shown in FIG. 1A. An electrical equivalent circuit of the memory array is given in FIG. 1B, wherein common elements within the structure of FIGS. 1A and 2-4 are identified by the same reference character.

Parallel wordlines 106 connect adjacent NAND strings of floating gates 102. The wordlines 106 are illustrated horizontally, and the strings are illustrated vertically in the figures. Wordlines 106 act as control gates for rows (as depicted) of floating gates. A NAND string generally includes a select gate followed by several floating gates and another select gate. The circuit diagram of FIG. 1B most clearly shows the vertical array of strings. In this case sixteen floating gates and thus sixteen wordlines are illustrated per string, however, the number of floating gates may be thirty-two or more, and is foreseen to increase in the future. Floating gates 102 are isolated from adjacent floating gates by isolation trenches 104. Isolation trenches 104 are also referred to as shallow trench isolation areas. The select gate line 105 on the source side ("SS") is continuous between trenches 104, as can be seen in section C-C of FIG. 4. It is not etched into individual floating gates. At the end of the wordline 106 above SS 105, each NAND string is electrically connected to SS 105 with a via, most easily seen in FIG. 1B and FIG. 3.

Metal bitlines 116 (only a portion of one is shown for the sake of clarity) connect to the N+ regions 114 within substrate 108 to sense amplifiers for reading the charge stored in the floating gates 102. The bitlines run parallel to the vertical array of strings. Thus, the bitlines have vertical axes, as do the strings in these illustrations. Thus, to read a particular floating gate a string is selected via the bitline and a wordline is also selected. The metal bitlines are generally, but not necessarily, formed in a conductive layer insulated from the wordlines. At the end of each string is another select gate coupled to the drain ("SD"). The drain and source can be interchanged in some configurations and more than 16 transistors can also be present in each string, thus also increasing the number of wordlines. Furthermore, any terms referring to the vertical or horizontal orientation are only used for ease of understanding and illustrative purposes, as the memory array can of course be depicted in different orientations.

Flanking each floating gate 102 are sidewalls 103. The sidewalls are protective or shielding elements that are located on the bitline sides of the floating gates 102. They may be thought of as being located on the bitline sides because they are located between floating gates in the same strings that are activated by the same bitlines 116, as will be discussed in more detail later with reference to FIG. 3. They may also be thought of as being in the bitline direction. Sidewalls 103 flank both a floating gate 102 and a wordline 106 located between a pair of sidewalls. The sidewalls 103 are also located between adjacent wordlines 106 because the wordlines are located directly above the rows of floating gates.

Figure 2:
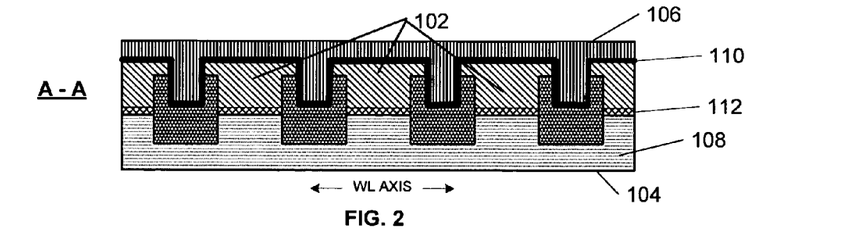
FIG. 2 is a cross section of memory array 100.

As seen in FIG. 2, there is a portion of gate oxide 112 between each floating gate 102 and the substrate 108. A dielectric material 110 separates the wordlines 106 from the floating gates 102 and the isolation trenches 104. Adjacent floating gates 102 are isolated from other floating gates in the same wordline, not only by isolating trenches 104, but also by wordlines 106. Wordlines 106 extend down between floating gates into isolation trenches 104, until, within, or past the level of gate oxide layer 112. This has three distinct benefits.

First, it reduces Yupin effects between adjacent cells in the wordline direction. Second, it improves the cell coupling ratio between the wordlines and the floating gates. The portion of the wordline that extends into the isolation trenches, to or past the depth of the floating gates, increases the overlap of the surface areas and volumes of the wordlines and floating gates. This increased overlap results in better coupling when a charge is read or stored during program, read, or erase operations.

Third, the electrical field across the dielectric layer 110 between adjacent floating gates is reduced, therefore reducing any leakage current through the dielectric layer that may occur as a result of the electrical field. The lesser the electrical field, the lesser the leakage current between two adjacent floating gates. Additionally, the leakage current path is greatly increased by the extended wordlines 106. Any leakage current must travel down and around the extended portion of the wordlines and then back up or over to the adjacent floating gates. The charge level programmed onto a floating gate of a cell changes when such a leakage current is present. Therefore, by minimizing the leakage current, and thus any change in charge of the floating gates, an increased number of levels can be discerned more reliably. This leads to a higher capacity, more cost efficient, and more reliable data storage system.

Figure 3:
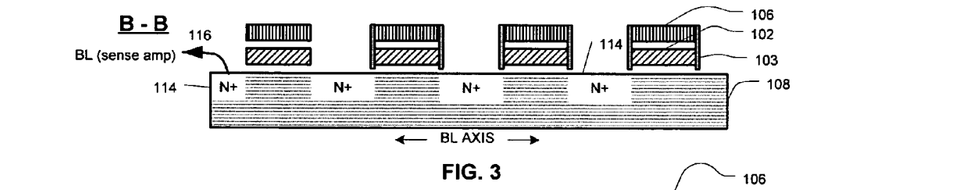
FIG. 3 is a cross section of memory array 100.
Figure 4:
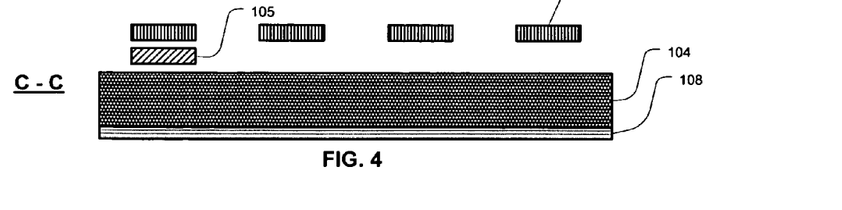
FIG. 4 is a cross section of memory array 100.

As seen in FIG. 3, sidewalls 103 are located on the sides of floating gates 102 and wordlines 106. The sidewalls 103 preferably comprise primarily a conductive material such as polysilicon but may also comprise primarily another type of material such as an insulator or semiconductive material. Sidewalls 103 are electrically isolated from floating gates 102, as will be seen in more detail with reference to FIGS. 6A-H. The sidewalls as shown extend to the upper surface of wordlines 106 in the embodiment shown. However, the sidewalls may extend (in a direction away from substrate 108) to any level between the upper surface of floating gates 102 to the upper level of wordlines 106. Sidewalls 103 are preferably but not necessarily electrically connected or coupled to wordlines 106.

Although sidewalls 103 are shown as being substantially rectangular, the shape may vary and is secondary to the functionality of the sidewalls. Additionally when viewed with an electron microscope, structures rarely appear rectilinear. As discussed previously, memory arrays are subject to errors in read and write operations due to the adjacent charges and electrical fields. Sidewalls 103 serve to shield floating gates 102 from these adjacent fields. This reduces errors in reading and writing to the memory cells and allows for further miniaturization of the memory array.

In one embodiment where the sidewalls 103 comprise primarily (conductive) polysilicon and are electrically connected to the wordline 106 that they flank, the sidewalls also aid in the programming and reading of the floating gates. This is because, as most clearly seen in FIG. 3, the sidewalls 103, together with the wordlines 106 located between the sidewalls, envelope the floating gate. The surface area and coupling ratio are therefore greatly increased, and a charge may be more effectively written to or read from the enveloped floating gate. Thus, in addition to the aforementioned shielding benefit in read/write operations, the structure of the present invention also aids the read/write operations by increasing the coupling between the floating gates and wordlines (control gates).

Figure 5:
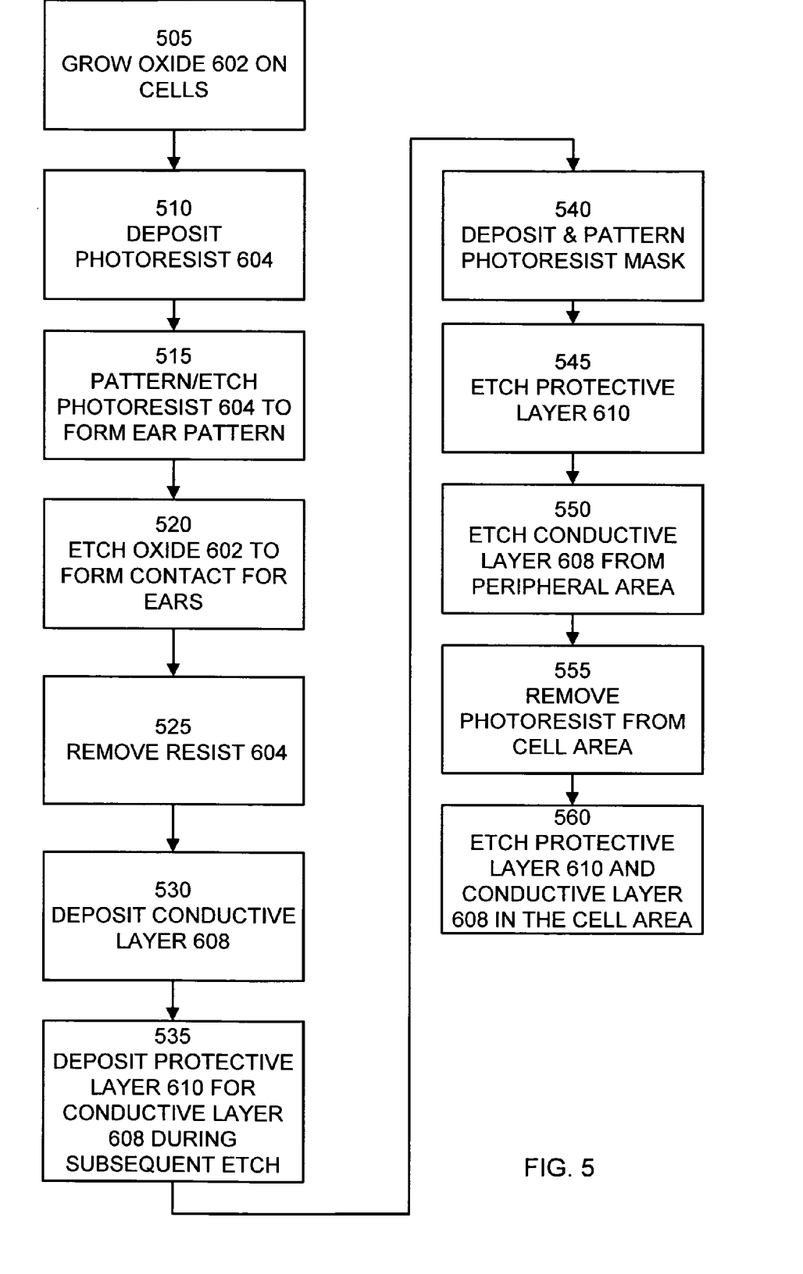
FIG. 5 is a flow chart of a method of forming an embodiment of the present invention.

FIG. 5 is a flowchart of some of the steps of making memory array 100 which should be referred to in tandem with FIGS. 6A-6H. Note that only the main steps are described and illustrated.

The memory array 100 is fabricated in a substrate 108. Substrate 108 preferably comprises silicon but may also comprise any substrate material known to those in the art such as Gallium Arsenide etc. FIG. 5 describes the portion of making the memory array after the memory cells have already been created. The creation of the memory cells involves forming a first set of parallel trenches in the substrate, depositing an oxide layer within the first set of trenches, and forming a series of floating gates between the trenches of the first set of trenches. A second set of parallel trenches is formed in the oxide layer deposited within the first set of trenches. The formation also comprises forming a wordline above adjacent floating gates, the wordline extending into the second set of trenches thereby isolating one of the floating gates from a charge applied at an adjacent floating gate.

The creation of the memory cells is further described in U.S. patent application Ser. No. 10/175764, entitled "deep Wordline Trench to Shield Cross Coupling between adjacent Cells for Scaled NAND," filed Jun. 19, 2002, which is hereby incorporated by this reference in its entirety. U.S. Pat. No. 5,867,429 entitled "High Density Non-Volatile Flash Memory Without Adverse Effects of Electric Field Coupling Between Adjacent Floating Gates" also contains information on the memory cells and is also hereby incorporated by this reference in its entirety. The specific sizes and materials of the preferred embodiments described are only given for illustrative purposes hence the present invention should not be limited by these specific details given for ease of understanding.

Figure 6A:
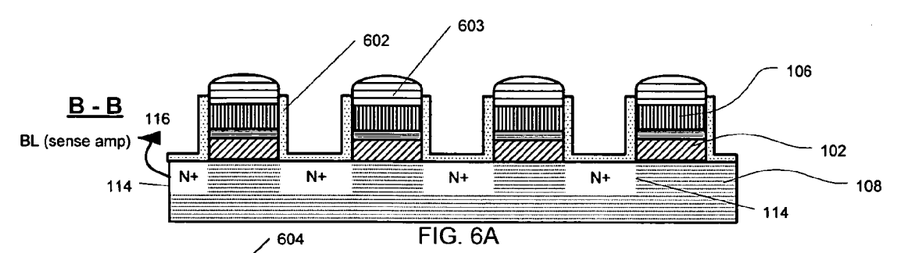
FIGS. 6A-6H are cross sections of memory array 100 at various stages during the fabrication process.
Figure 6B:
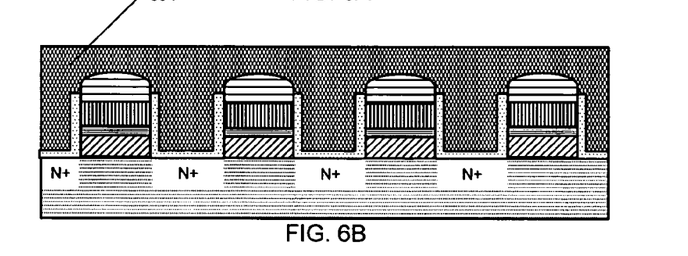
Figure 6C:
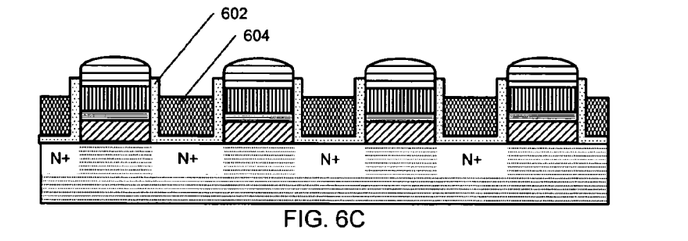

In step 505, oxide 602 is grown upon the memory cells, as seen in FIG. 6A. Thermal oxide 602 is about 180 Angstroms thick +/− about 50 Angstroms and can also be other well known insulating layers such as TEOS, ONO, or SiN. Oxide 602 will not grow upon nitride 603 on the top of the memory cells. Next, a photoresist blanket 604 is deposited in step 510, as seen in FIG. 6B. Photoresist 604 is preferably an organic material such as Novoluk, but may be any type of photoresist known in the art. In step 515, the photoresist 604 is patterned and etched, leaving a portion of oxide 602 extending above/beyond the remaining photoresist 604, as seen in FIG. 6C. Photoresist 604 is precisely etched away to a level between the lower and upper surface of wordlines 106.

Figure 6D:
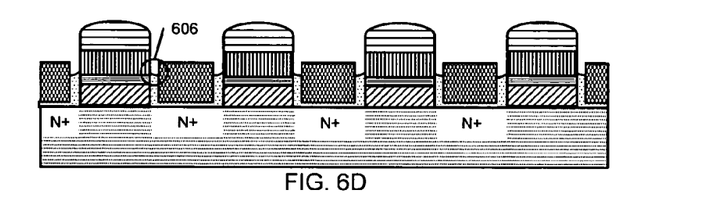

Next, in step 520, the oxide 602 is etched to form a contact for the "ears." It is etched down to, or below the level of photoresist 604 and as can be seen in FIG. 6D, there is a slight undercut 606 for the electrical contact of the ears with the wordlines 106. The ears are also interchangeably referred to as sidewalls throughout this application. Oxide 602 is preferably plasma etched but may also be wet etched or removed by any well known methods. In step 525 the photoresist 604 is removed as seen in FIG. 6E, preferably by reactive ion etching techniques.

Figure 6E:
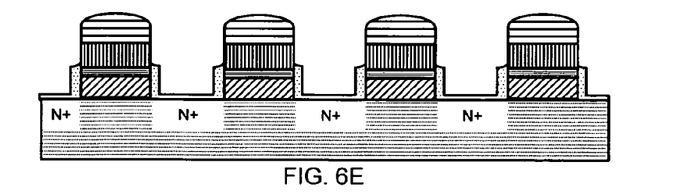
Figure 6F:
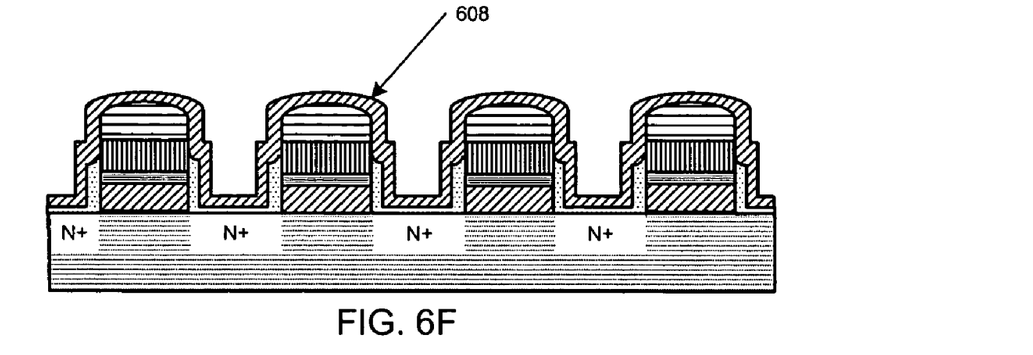

In step 530 a conductive material 608 such as polysilicon is deposited upon the array seen in FIG. 6E. This is shown in FIG. 6F. Roughly 150 Angstroms of polysilicon is deposited.

Figure 6G:
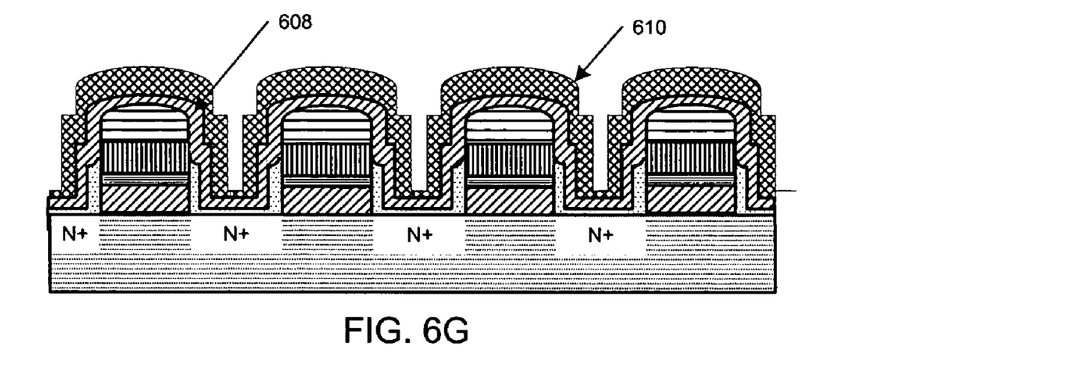
Figure 6H:
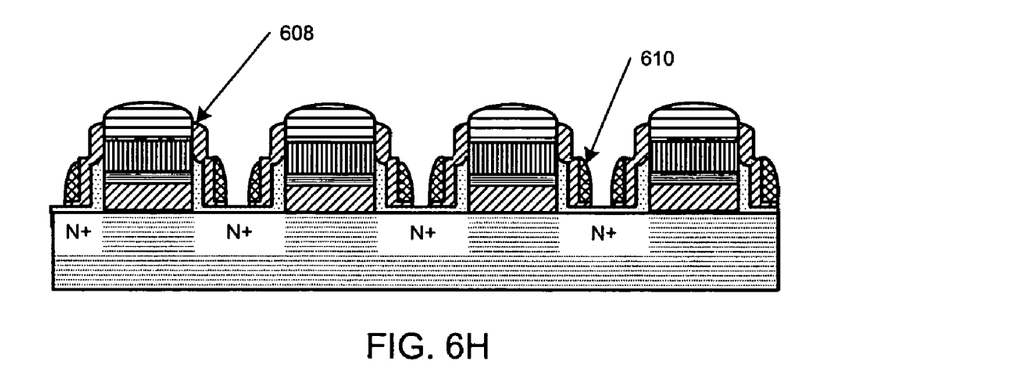

In step 535, a protective layer 610 is deposited upon the conductive layer, as can be seen in FIG. 6G. Protective layer 610 may be made of a dielectric material such as a TEOS based oxide layer. Protective layer 610 serves to protect the underlying conductive material 608 during a subsequent etch through the protective layer 610 in step 545. In step 550 the protective layer 610 and conductive layer 608 are etched out of the peripheral area of memory array 100, i.e. the area generally not used for data storage. This is preferably done with a chemical plasma etch. In step 555, the photoresist is removed from the cell area. The cell area, unlike the peripheral area, is where the data is stored. In step 560 the protective layer 610 and conductive layer 608 are etched out from between the cells. The area between each of the memory cells must be cleared in order to dope the source and drain (N+) regions 114, which although not formed until after step 560, have been shown in the figures for the sake of reference. The resultant structure shown in FIG. 6H illustrates memory array 100 after steps 540-560 have been performed.

While embodiments of the present invention have been shown and described, changes and modifications to these illustrative embodiments can be made without departing from the present invention in its broader aspects. Thus, it should be evident that there are other embodiments of this invention which, while not expressly described above, are within the scope of the present invention and therefore that the scope of the invention is not limited merely to the illustrative embodiments presented. Therefore, it will be understood that the appended claims set out the metes and bounds of the invention. However, as words are an imperfect way of describing the scope of the invention, it should also be understood that equivalent structures and methods while not within the express words of the claims are also within the true scope of the invention.

The invention claimed is:

1. A flash memory device formed from a substrate, the device comprising:
   strings of transistors of a NAND architecture comprising a first select gate, a plurality of floating gates, and a second select gate,
   each floating gate having at least two sides perpendicular to the axes of the strings;
   a conductive isolating member adjacent to each of the at least two perpendicular sides of the floating gate and located between adjacent transistors in the strings of transistors, each isolating member shielding a selected floating gate from a charge stored in an adjacent component;
   wherein the isolating members and the wordlines comprise a conductive material;
   wherein the isolating members are electrically connected to a wordline above a floating gate that the isolating members shield;
   wherein the floating gates are approximately T shaped; and
   wherein isolating members electrically coupled to the wordlines flank the floating gates.

2. The flash memory device of claim 1, wherein the floating gates are formed between shallow trench isolation areas and wherein the device further comprises wordlines extending across adjacent strings and extending between the floating gates into the shallow trench isolation areas thereby isolating adjacent floating gates.

3. The flash memory device of claim 1 wherein the isolating members have two principal faces, the faces substantially parallel to the at least two sides of each floating gate and substantially perpendicular to the axes of the strings.

4. The flash memory device of claim 1 wherein the isolating members extend a distance between the substrate and an upper level of the floating gates.

5. The flash memory device of claim 4 wherein the floating gates have an upper level and a lower level, the isolating members extending from the substrate a distance between the lower and upper level.

6. The flash memory device of claim 1 wherein the isolating members shield a floating gate of the plurality of floating gates from an electrical field of an adjacent floating gate, thereby minimizing field effect coupling between adjacent floating gates.

7. The flash memory device of claim 6 wherein the adjacent floating gate is diagonally adjacent or horizontally adjacent to the selected floating gate and wherein the isolating members further minimize field effect coupling in the wordline direction.

8. A non-volatile memory device comprising:
    floating gates that store a charge;
        bitlines that select amongst the floating gates, each bitline having a bitline axis;
        wordlines that select amongst the floating gates;
        conductive sidewall elements positioned along the bitline axes, the sidewall elements located at sides of the floating gates between adjacent floating gates, the sidewall elements shielding the floating gates; and
    wherein the non-volatile storage device is NAND flash memory.

9. The memory device of claim 8 wherein the sidewall elements shield the floating gates from an electrical field having a component in the direction of the bitline axes.

10. The memory device of claim 8 wherein the sidewall elements extend from the substrate to the floating gates.

11. The memory device of claim 10 wherein the floating gates have an uppermost and a lowermost surface, the sidewall elements extending from the substrate until or beyond the level of the lowermost surface.

12. The memory device of claim 10 wherein the floating gates have an uppermost and a lowermost surface, the sidewall elements extending from the substrate until or beyond the level of the uppermost surface.

13. The memory device of claim 8 wherein the sidewall elements are electrically coupled to a wordline located between adjacent pairs of sidewall elements.

14. The memory device of claim 13 wherein the coupled sidewalls effectively increase the surface area of the wordline and the electrical coupling between the wordline and the floating gates, thereby aiding in read and write operations.

15. The memory device of claim 8 wherein the wordlines extend between adjacent floating gates so as to shield a selected floating gate from an electrical field of adjacent floating gates.

16. A method of forming NAND flash memory comprising:
    forming a plurality of NAND strings of floating gates;
    forming control gates above the floating gates;
    forming bitlines, the bitlines used together with the control gates to read and write from a floating gate, the direction of the bitlines substantially perpendicular to the direction of the control gates, the floating gates having bitline sides in the bitline direction and control gate sides in the control gate direction;
    forming conductive members between the bitline sides of the floating gates, the members shielding the floating gates from electrical fields having a component in the bitline direction.

17. A flash memory device comprising:
    floating gates for storing data located above a substrate;
    means for isolating adjacent floating gates in the wordline direction;
    means for isolating adjacent floating gates in the bitline direction;
    means for reading the data stored in the floating gates, the means for reading the data located above the floating gates and interconnecting strings of floating gates, the means for isolating adjacent floating gates in the bitline direction electrically connected to the means for reading the data;
    wherein the means for reading the floating gates extends within the means for isolating adjacent floating gates in the wordline direction.

18. The flash memory device of claim 17 wherein the means for reading shields adjacent floating gates from Yupin effect errors and from disturbs.

19. A method of making a memory device in a substrate comprising:
    forming a series of floating gates between a first set of trenches each floating gate having two approximately parallel bitline sides and two approximately parallel roughly rectangular wordline sides;
    forming a second set of parallel trenches in an oxide layer deposited within the first set of trenches;
    forming a wordline above adjacent floating gates, the wordline extending into the second set of trenches and isolating one of the floating gates from a charge applied at an adjacent floating gate; and
    forming a conductive element at each of the approximately parallel bitline sides of the floating gates.

20. The method of claim 19 wherein the conductive elements are located on both sides of a floating gate and wherein the method further comprises electrically contacting the elements to the wordline that selects the floating gate.

21. The method of claim 20 wherein the conductive elements shield a selected floating gate from an electrical field of an adjacent floating gate and minimize field effect coupling in the bitline direction between adjacent floating gates.

22. The method of claim 21 wherein the adjacent floating gate is diagonally adjacent or horizontally adjacent to the selected floating gate and wherein the conductive elements further minimize field effect coupling in the wordline direction.

23. The method of claim 19 wherein the memory device formed is a NAND flash memory device.

24. A method of making a non-volatile memory array, comprising:
    forming a plurality of NAND strings of flash memory cells, memory cells having floating gates extending across the surface of a substrate and forming a plurality of control gates extending in a first direction and overlying the plurality of strings of floating gates, the plurality of strings of floating gates extending in a second direction that is perpendicular to the first direction;
    forming insulating elements along sides of the plurality of floating gates that extend in the first direction, the insulating elements extending above lower surfaces of the plurality of control gates; and
    forming conductive sidewall portions overlying insulating elements, the conductive portions in contact with control gates but insulated from floating gates by the insulating elements.

25. The method of claim 24 wherein the insulating elements are first formed to extend along the sides of the plurality of floating gates and along sides of the plurality of control gates and are subsequently etched to provide a contact area to the control gates.

26. The method of claim 24 further comprising, subsequent to the forming the conductive sidewall portions, implanting source and drain regions.

27. The method of claim 26 further comprising forming protective spacers on sides of the conductive sidewall portions and wherein the implanting is in a region defined by the protective spacers.

28. A non-volatile memory array, comprising:
a plurality of floating gates on a substrate;
a plurality of control gates, an individual control gate overlying a floating gate of the plurality of floating gates so that first and second sides of the control gate are coplanar with first and second sides of the floating gate;
a first insulating element covering the first side of the floating gate and extending to partially cover the first side of the control gate;
a second insulating element covering the second side of the floating gate and extending to partially cover the second side of the control gate;
a first conductive sidewall that extends from the first side of the control gate and overlies the first insulating element;
a second conductive sidewall that extends from the second side of the control gate and overlies the second insulating element; and
wherein the floating gate is T-shaped in cross-section.

29. The non-volatile memory array of claim 28 wherein the T-shaped floating gate extends over first and second shallow-trench isolation areas.

30. The non-volatile memory array of claim 29 wherein both first and second shallow-trench isolation areas have trenches in their upper surfaces and a wordline extends into the trenches, the wordline connected to the control gate.

31. The non-volatile memory device of claim 8 wherein the sidewall elements are not electrically connected to a wordline.

32. The method of claim 16 wherein the conductive members are not electrically connected to the control gates.

* * * * *